(12) United States Patent
Tomioka

(10) Patent No.: US 7,738,248 B2
(45) Date of Patent: Jun. 15, 2010

(54) ELECTRONIC DEVICE, LOOP HEAT PIPE AND COOLING DEVICE

(75) Inventor: Kentaro Tomioka, Sayama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/330,266

(22) Filed: Dec. 8, 2008

(65) Prior Publication Data

US 2009/0219695 A1 Sep. 3, 2009

(30) Foreign Application Priority Data

Feb. 28, 2008 (JP) ............................. 2008-048578

(51) Int. Cl.
*H05K 7/20* (2006.01)
*H01L 23/36* (2006.01)
(52) U.S. Cl. .................. 361/679.52; 361/700; 361/701; 361/679.47; 165/104.21; 165/104.26; 165/104.33
(58) Field of Classification Search ............ 361/679.46, 361/679.47, 679.52, 679.55, 700, 701, 702, 361/703; 165/80.3, 80.4, 80.5, 104.21, 104.26, 165/104.33, 185, 46, 81, 140, 141, 170, 82; 257/713–718; 29/890.03, 890.032, 890.045, 29/890.039; 174/15.1, 16.3, 252; 62/259.2
See application file for complete search history.

(56) References Cited

U.S. PATENT DOCUMENTS

| | | | | |
|---|---|---|---|---|
| 3,786,861 A | * | 1/1974 | Eggers .................. | 165/104.26 |
| 4,046,190 A | * | 9/1977 | Marcus et al. ......... | 165/104.26 |
| 4,118,756 A | * | 10/1978 | Nelson et al. ............... | 361/700 |
| 5,076,351 A | * | 12/1991 | Munekawa et al. .... | 165/104.21 |
| 6,382,309 B1 | * | 5/2002 | Kroliczek et al. ...... | 165/104.26 |
| 6,508,302 B2 | * | 1/2003 | Ishida et al. ........... | 165/104.26 |

(Continued)

FOREIGN PATENT DOCUMENTS

JP        11-183069        7/1999

(Continued)

OTHER PUBLICATIONS

Japanese Patent Application No. 2008-048578 Notice of Reasons for Rejection, mailed Mar. 31, 2009, (English translation).

(Continued)

*Primary Examiner*—Michael V Datskovskiy
(74) *Attorney, Agent, or Firm*—Blakely, Sokoloff, Taylor & Zafman LLP

(57) ABSTRACT

According to one embodiment, an electronic device includes a heat generating part housed inside a cabinet and a loop heat pipe housed inside the cabinet, which includes an internal flow path having a loop shape in which a working fluid is sealed. The loop heat pipe further includes a heat receiving unit, a heat radiating unit, a vapor flow path which allows a gasified portion of the working fluid to flow from the heat receiving unit towards the heat radiating unit, a liquid returning flow path which allows a liquefied portion of the working fluid to flow from the heat radiating unit towards the heat receiving unit, and a wick provided at a position adjacent to the vapor flow path inside the liquid returning flow path. The wick also serves as a partition portion which partitions the vapor flow path and the liquid returning flow path from each other.

9 Claims, 5 Drawing Sheets

U.S. PATENT DOCUMENTS

| | | | |
|---|---|---|---|
| 6,564,860 B1 * | 5/2003 | Kroliczek et al. | 165/104.26 |
| 6,725,910 B2 * | 4/2004 | Ishida et al. | 165/104.26 |
| 6,889,756 B1 * | 5/2005 | Hou | 165/104.33 |
| 7,275,588 B2 * | 10/2007 | Hsu | 165/104.26 |
| 7,372,697 B2 * | 5/2008 | Tomioka | 361/699 |
| 2002/0074108 A1 * | 6/2002 | Khrustalev et al. | 165/104.26 |
| 2007/0006993 A1 * | 1/2007 | Meng et al. | 165/104.26 |

FOREIGN PATENT DOCUMENTS

| | | |
|---|---|---|
| JP | 2002-062071 | 2/2002 |
| JP | 2004-327481 | 11/2004 |
| JP | 2007-113864 | 5/2007 |

OTHER PUBLICATIONS

Japanese Patent Application No. 2008-048578 Final Notice of Rejection mailed Jun. 30, 2009 (English translation).

* cited by examiner

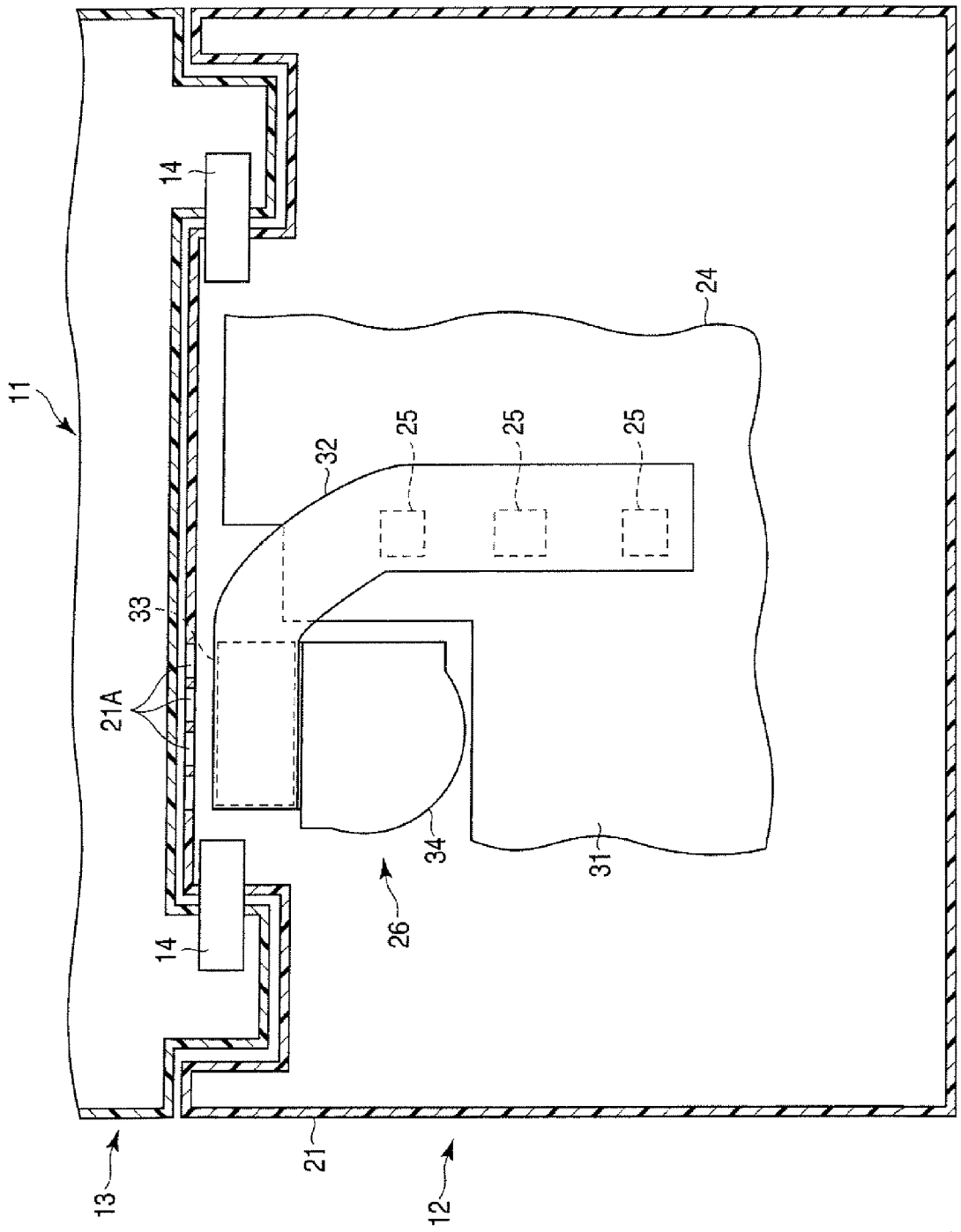
F I G. 2

ELECTRONIC DEVICE, LOOP HEAT PIPE AND COOLING DEVICE

CROSS-REFERENCE TO RELATED APPLICATIONS

This application is based upon and claims the benefit of priority from Japanese Patent Application No. 2008-048578, filed Feb. 28, 2008, the entire contents of which are incorporated herein by reference.

BACKGROUND

1. Field

One embodiment of the present invention relates to an electronic device equipped with a loop heat pipe for cooling a heat generating part, a loop heat pipe and a cooling device.

2. Description of the Related Art

For example, a Japanese patent application, Jpn. Pat. Appln. KOKAI Publication No. 2004-324906 discloses a loop-shaped heat pipe having the following structure. This loop heat pipe includes a container inside which a loop-shaped flow path formed around, a wick provided in the flow path inside the container and a working fluid provided to fill the internal space of the container. The wick is formed of a cloth material which can exhibit a capillary action. The wick is provided in the section where a portion of the working fluid condensed into liquid passes.

In the conventional example, a gasified portion of the working fluid is allowed to pass through a cavity section of the inside of the container. On the other hand, the liquefied portion of the working fluid is allowed to pass a section filled with the wick inside of the container. Thus, as the working fluid is circulated inside the container, heat generating parts of the electronic device are cooled down.

However, due to the fact that the above-described conventional loop-type heat pipe has a loop shape, it is necessary to form a through hole in a central portion of the container, and the formation of such a hole results in a high production cost, which is a problem. Further, although the conventional type heat pipe is able to cool down a plurality of heat generating parts, it entails the following drawback. That is, for example, when a plurality of heat generating parts are provided in the section where the liquefied portion of the working fluid is allowed to pass, the liquefied portion is evaporated where the parts are provided, which makes the efficiency of the circulation of the working fluid lower. For this reason, the conventional heat pipe is not adequate for cooling down a plurality of heat generating parts.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 2 is an exemplary cross sectional view of the portable computer shown in FIG. 1, taken along a horizontal direction of a cabinet thereof;

DETAILED DESCRIPTION

Various embodiments according to the invention will be described hereinafter with reference to the accompanying drawings. In general, according to one embodiment of the invention, an electronic device includes a heat generating part housed Inside a cabinet and a loop heat pipe housed inside the cabinet, which includes an internal flow path having a loop shape in which a working fluid is sealed. The loop heat pipe further includes a heat receiving unit, a heat radiating unit, a vapor flow path which allows a gasified portion of the working fluid to flow from the heat receiving unit towards the heat radiating unit, a liquid returning flow path which allows a Liquefied portion of the working fluid to flow from the heat radiating unit cowards the heat receiving unit, and a wick provided at a position adjacent to the vapor flow path inside the liquid returning flow path. The wick also serves as a partition portion which partitions the vapor flow path and the liquid returning flow path from each other.

Figure 1:
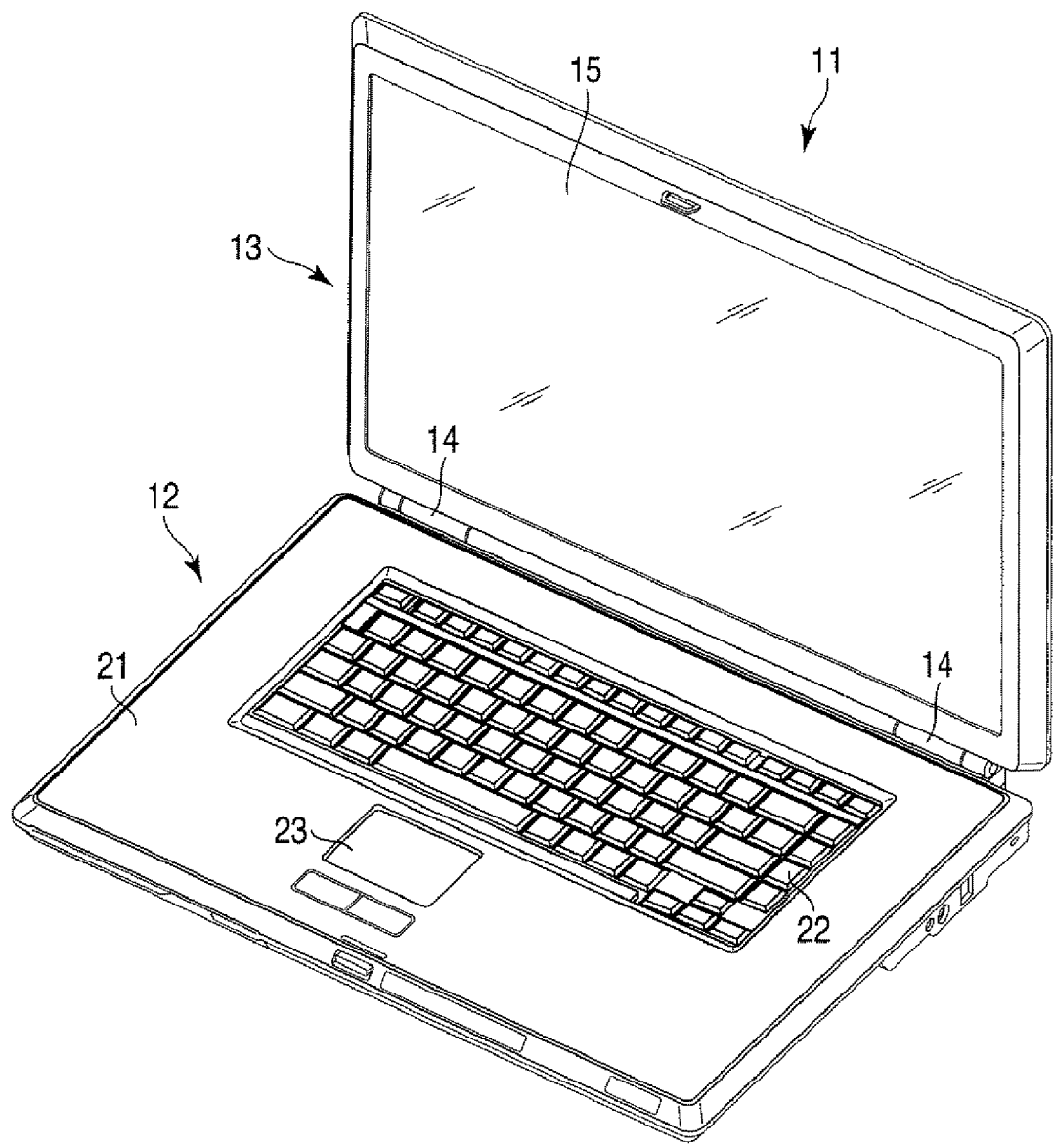
FIG. 1 is an exemplary perspective view showing a portable computer, which is an example of the electronic device according to the first embodiment.

The first embodiment of the electronic device will now be described with reference to FIGS. 1 to 5. As shown in FIG. 1, a portable computer 11, which is an example of the electronic device, includes a main body unit 12, a display unit 13 and a hinge mechanism 14 provided between the main body unit 12 and the display unit 13. The hinge mechanism 14 supports the display unit 13 so as to be pivotable with respect to the main body unit 12.

The display unit 13 includes a display 15. The display 15 is, for example, a liquid crystal display. As can be seen in FIGS. 1 and 2, the main body unit 12 contains a cabinet 21, a keyboard mounted to the cabinet 21, a touch pad 23, a printed circuit board 24 housed inside the cabinet 21, and a cooling device 26 also housed inside the cabinet 21 in order to cool down heat generating parts 25 of the printed circuit board 24.

Figure 3:
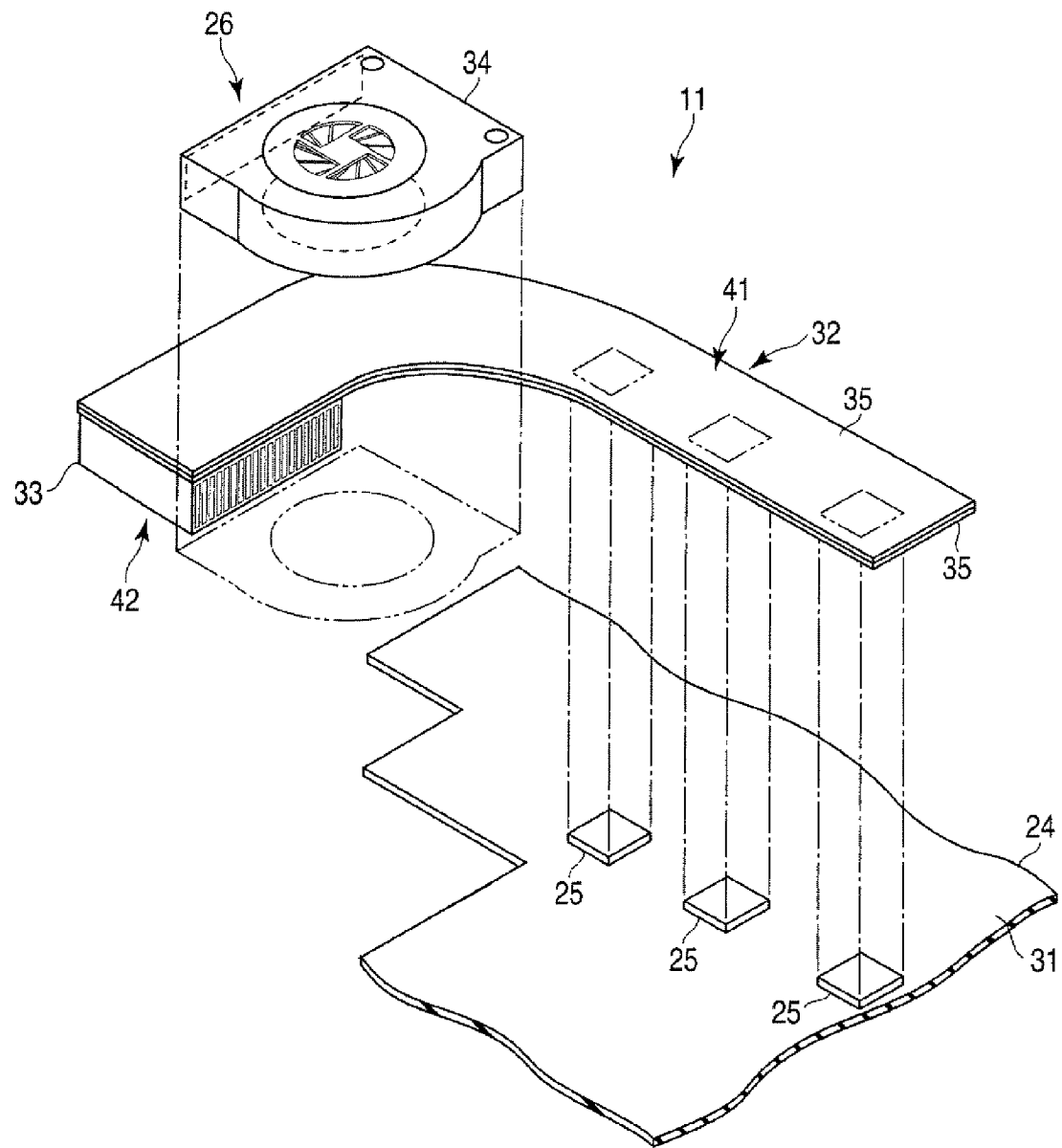
FIG. 3 is an exemplary decomposed perspective view of a cooling device housed inside the cabinet shown in FIG. 2.

As can be seen in FIGS. 2 and 3, the printed circuit board 24 includes a printed wiring board 31 in which a plurality of copper-made wiring layers are laminated one on another, and three heat generating parts 25 mounted on the printed circuit board 24. The three heat generating parts 25 are, for example, a central processing unit (CPU), a north bridge and a graphics chip in this embodiment, but the present invention is not limited to this configuration. The heat generating parts 25 may be some other circuit parts. Also, in this embodiment, there are three heat generating parts 25 to be cooled down with the cooling device 26, but the present invention is not limited to this configuration. For example, it is possible to have such a configuration that one heat generating part 25 is cooled down by the cooling device 26 in the embodiment.

The cooling device 26 includes a loop heat pipe 32 which cools down the heat generating parts 25, a heat sink 33 connected to a heat radiating portion 42 of the loop heat pipe 32, and fan unit 34 which supplies air to the heat sink in order to promote the cooling down of the heat sink 33. The heat sink 33 includes, for example, a plurality of fins, and it is formed of a high heat-conductive metal such copper or aluminum alloy. It should be noted here that the cooling device 26 referred to in the present invention is of a concept which includes the heat generating parts 25. Also, note that the heat sink 33 is fixed to the surface of the same side connected to the heat generating parts 25, and with this structure, the cooling device 26 can be made thin.

As can be seen in FIG. 3, the loop heat pipe 32 has a flat plate shape, and it includes, as an example, an internal flow path having a loop shape within one plane. The loop heat pipe 32 is constituted as the working fluid is sealed in the internal flow path.

The loop heat pipe 32 is formed by affixing two copper-made plate members 35 to each other. The two plate members each have a frame portion 36 in the peripheral portion. To one of the two plate members 35, sintered metal is attached by sintering, and the sintered metal gives rise to a wick 45 which will be later explained. The loop heat pipe 32, since it is formed by affixing the two plate members 35 together, can be manufactured at a production cost lower as compared to that of the conventional loop heat pipe which has a through hole in its central portion. It should be noted that in this embodiment, the wick 45 is anchored to the ore of the plate members 35 which is in contact with the heat generating parts 25. When affixing the two plate members 35 together, the wick 35 is arranged to abut against the other one of the plate members 35 without a gap. However, there may be a gap between the wick 45 and the other plate member 35, and it suffices if a vapor flow path 43 and a liquid returning flow path 44 can be substantially partitioned from each other.

Figure 4:
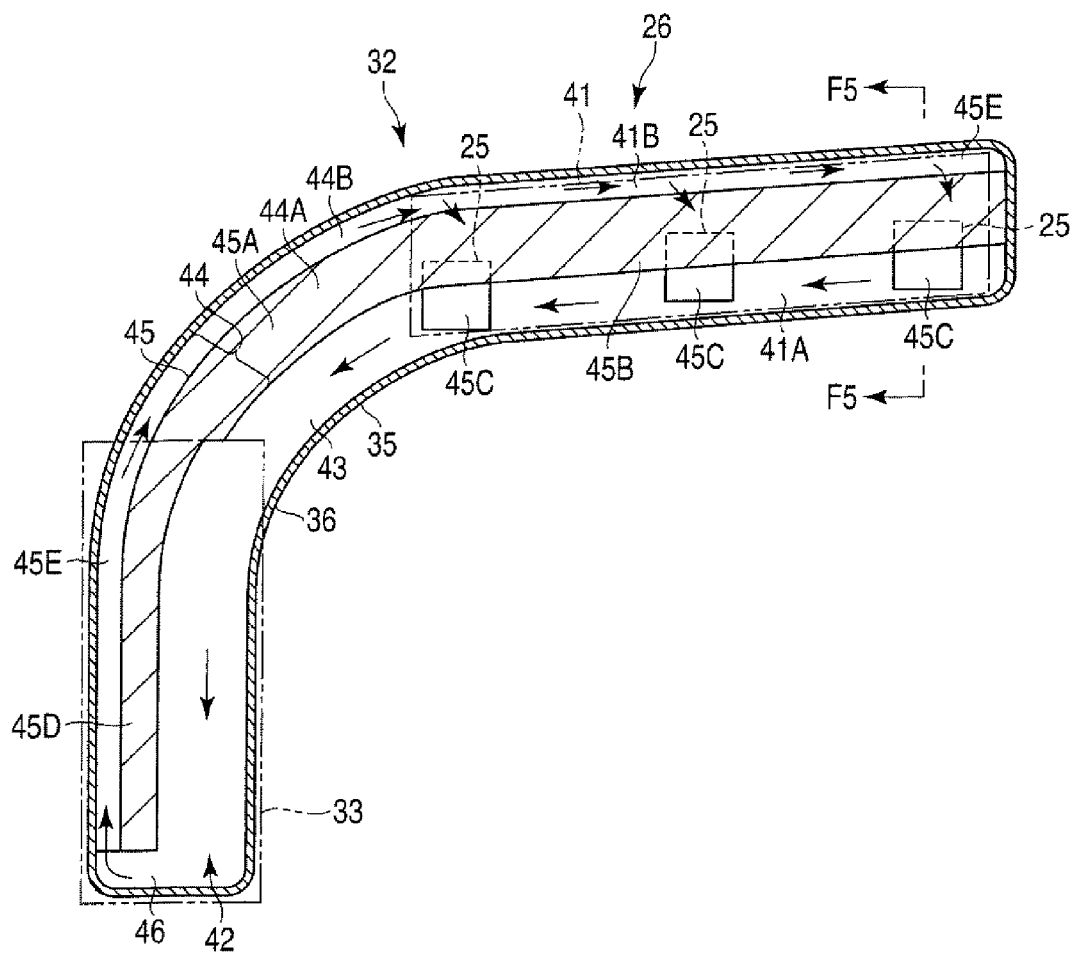
FIG. 4 is an exemplary cross sectional view of the cooling device shown in FIG. 3, taken along a horizontal direction of a loop heat pipe thereof.

As shown in FIG. 4, the loop heat pipe 32 includes a heat receiving portion 41 thermally connected to the heat generating parts 25, a heat radiating portion 42 thermally connected to the heat sink 33, the vapor flow path 43 which connects the heat receiving portion 41 and the heat radiating portion 42 to each other, the liquid returning flow path 44 which connects the heat receiving portion 41 and the heat receiving portion 42 at a position distant from the vapor flow path 43, and the wick 45 provided inside the liquid returning flow path 44.

The heat receiving portion 41 promotes the gasification of the working fluid at this position and thus it can deprive heat from the heat generating parts 25. On the other hand, the heat generating portion 42 promotes the liquefying of the working fluid at this position, and thus it can release the heat received from the heat receiving portion 41 to the outside, that is, the heat sink 33.

The working fluid changes its phase between liquid and gas. The working fluid is, for example, water. However, the working fluid is not limited to water, but it may be, for example, ethanol, ammonium or butane.

It should be noted that the heat transport amount of the loop heat pipe 32 has been dramatically improved as compared to the case of a conventional rod-type heat pipe, and therefore it cannot be compared with the conventional type on the same basis. More specifically, the heat transfer amount of the conventional rod-type heat pipe (having an outer diameter of 6 mm) is, for example, about 35 W, whereas the heat transfer amount of the loop heat pipe 32 (having a thickness of 1.2 mm) of this embodiment is, for example, about 70 W.

The vapor flow path 43 allows the gasified portion of the working fluid flow from the heat receiving portion 41 towards the heat radiating portion 42. The width of the vapor flow path 43 is larger than that of the liquid returning flow path 44. The liquid returning flow path 44 is provided adjacent to the vapor flow path 43. The liquid returning flow path 44 allows the working fluid pass from the heat radiating portion 42 towards the heat receiving portion 41. The liquid returning flow path 44 includes a first region 44A in which a main portion 45A of the wick 45 is provided and a second region 44B which is set distant from the main portion 45A and formed to have a cavity.

In this embodiment, the wick 45 is a generic name for the structure for handling the liquefied portion of the working fluid under the capillary action so as to return the working fluid from the heat radiating portion 42 to the heat receiving portion 41 in the circulation. In this embodiment, the wick 45 is formed of, for example, a porous material prepared by sintering metal powder, more specifically, copper powder to the inner side of the plate member 35. However, the wick 45 is not limited to a porous material, but it may be, for example, a metal mesh, fine groove, a wire or cloth.

The wick 45 is provided in a position adjacent to the vapor flow path 43, and it also serves as a partition portion which partitions the vapor flow path 43 and the liquid returning flow path 44. The wick 45 includes the main portion 45A installed in the first region 44A of the liquid returning flow path 44, a first projecting portion 45B projecting from the main portion 45A to the inner side of the heat receiving portion 41, a second projecting portion 45C projecting from the first projecting portion 45B, a third projecting portion 45D projecting from the main portion 45A to the inner side of the heat radiating portion 42, and a fourth protecting portion 45E projecting from the main portion 45A and the first projecting portion 45B to the second region 44B of the liquid returning flow path 44. The first protecting portion 45B, the second projecting portion 45C, the third projecting portion 45D and the fourth projecting portion 45E are formed together with the main portion 45A as an integral unit.

The first protecting portion 45B separates the inner space of the heat receiving portion 41 into a first portion 41A communicating to the vapor flow path 43 and a second portion 41B communicating to the liquid returning flow path 44. The heat receiving portion 41 is thermally connected to the heat generating parts 25 at such a position across the first portion 41A and the first projecting portion 45B of the wick 45. Here, the heat generating parts 25 are arranged side by side in line at a position across the first portion 41A and the first projecting portion 45B.

Figure 5:
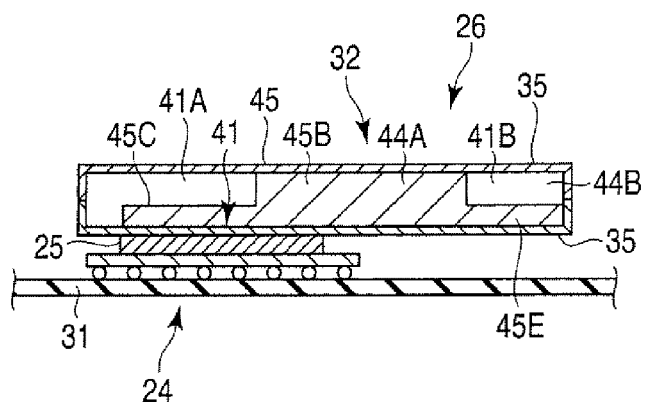
FIG. 5 is an exemplary cross sectional view of the loop heat pipe shown in FIG. 4, taken along the line F5-F5.

As can be seen in FIGS. 4 and 5, the second projecting portion 45C projects from the first projecting portion 45B towards the first portion 41A of the heat receiving portion 41 to such a position where it overlays with the heat generating parts 25. The second projecting portion 45C is formed to have a thin plate shape. The thickness of the second projecting portion 45C is, for example, no more than a half of the thickness of the main portion 45A of the wick 45.

The third projecting port on 45D projects to such a position where it partially overlays with the heat sink 33 in the inner space of the heat radiating portion 42. The inner space of the heat radiating portion 42 has a gap portion 46 which is not separated by the third projecting portion 45D. The gap portion 46 is a cavity, which communicates the vapor flow path 43 and the liquid returning flow path 44 to each other. In this embodiment, the fourth projecting portion 45W is formed in the entirety of the second region 44B of the liquid returning flow path 44. The thickness of the fourth projecting portion 45E is set no more than a half of the thickness of the main portion 45A.

The operation of the cooling device 26 of this embodiment will now be described with reference to FIGS. 4 and 5. As shown in FIG. 5, the heat generated in the heat generating parts 25 is transferred to the heat receiving portion 41 of the loop heat pipe 32. Here, in the heat receiving portion 41, the gasification of the working fluid is promoted, and due to the gasification, the heat of the heat generating parts 25 is taken into the loop heat pipe 32. Here, the gasification of the working fluid occurs mainly in the second projecting portion 45C of the wick 45 and the section of the first projecting portion 45B which is adjacent to the first portion 41A. In the border line section between the second portion 41B of the heat receiving portion 41 and The first projecting portion 45B, which is located distant from the heat generating parts 25, the gasification does not occur.

The gasified portion of the working fluid, which is created in the heat receiving portion 41 is sent to the heat radiating portion 42 via the vapor flow path 43. In the heat radiating portion 42, the heat of the working fluid is transferred to the heat sink 33, and thus the liquefying of the working fluid is promoted. The liquefied portion of the working fluid, created in the heat radiating portion 42 is sent to the heat receiving portion 41 via the main portion 45A of the wick 45 located in the first region 44A of the liquid returning flow path 44. Further, the liquefied portion of the fluid is sent to the heat receiving portion 41 via the second region 44B of the liquid returning flow path 44. In this manner, the working fluid is circulated within the loop heat pipe 32, and the transfer of heat is smoothly performed. The heat transmitted to the heat sink 33 is propagated to the air by a blow from the fan unit 34. The air is discharged to the outside of the cabinet 21 via the through hole 21A formed in the cabinet 21.

According to this embodiment, the portable computer 11, which is an example of the electronic device, includes the cabinet 21, the heat generating parts 25 contained inside the cabinet 21 and the loop heat pipe 32 also contained inside the cabinet 21 and formed by sealing the working fluid into the Internal flow path having a loop shape. Further, the loop heat pipe 32 includes the heat receiving portion 41 which deprives the heat from the heat generating parts 25 by the gasification of the working fluid, the heat radiating portion 42 which releases the heat received by the heat receiving portion 41 to the outside by the liquefying of the working fluid, the vapor flow path 43 which connects the heat receiving portion 41 and the heat radiating portion 42 to each other and allows the gasified portion of the working fluid to flow from the heat receiving portion 41 towards the heat radiating portion 42, the liquid returning flow path 44 provided at a position distant from the vapor flow path 43, which connects the heat receiving portion 41 and the heat radiating portion 42 to each other and allows the liquefied portion of the working fluid to flow from the heat radiating portion 42 towards the heat receiving portion 41, and the wick 45 provided at a position adjacent to the vapor flow path 43 inside the liquid returning flow path 44, which also serves as a partition portion which partitions the vapor flow path 43 and the liquid returning flow path 44 from each other.

With the above-described structure, the vapor flow path 43 and the liquid returning flow path 44 can be partitioned from each other by means of the wick 45, and therefore there is no need to provide a separate partition member. Thus, the structure of the loop heat pipe 32 can be simplified. Further, since the wick 45 is provided in the liquid returning flow path 44, it becomes possible to convey the liquefied portion of the working fluid in a direction against the gravity. In this manner, the loop heat pipe 32 can be set free from its angle dependency, and thus it becomes possible to prevent the occurrence of the so-called top heat, in which the circulation of the working fluid is stopped if the pipe is set at a certain angle. Furthermore, the loop heat pipe 32 is formed in a rod shape, but to have a loop shape, and therefore the entire shape of the pipe can be made into a flat plate, which makes it possible to require a less space to install the heat pipe.

In this embodiments, the wick 45 includes the main portion 45A and the first projecting portion 45B extending from the main portion 45A. The first protecting portion 45B projects to the inner side of the heat receiving portion 41 such as to divide the inner section thereof into the first portion 41A communicating to the vapor flow path 43 and the second portion 41B communicating to the liquid returning flow path 44. The heat receiving portion 41 is thermally connected to the heat generating parts 25 at such a position across the first portion 41A and the first projecting portion 45B.

With this structure, it is possible to arrange the connection portions of the heat generating parts 2D in the border section between the first projecting portion 45B and the second portion 41B. In this manner, the gasification of the working fluid can be promoted in the border section. On the other hand, the border section between the first projecting portion 45B and the second portion 41B is located at a position distant from the heat generating parts 25, and thus the temperature of the border section can be maintained low. Therefore, it becomes possible to prevent the working fluid from gasifying from this section as much as possible. Further, with the arrangement that the border section between the first projecting portion 45B and the second portion 41B is located at a position distant from the heat generating parts 25, the pressure loss in this direction can be increased, and thus it is possible to prevent bubbles of the evaporated portion of the working fluid from flowing in this direction. As a result, the occurrence of a back-flow in the working fluid can be prevented.

In this embodiment, the wick 45 is a porous material prepared by sintering metal powder. With this structure, the loop heat pipe 32 can be set Free from its angle dependency by utilizing the capillary action of the porous material. Further, as compared to other types of wick 45, this wick makes it possible to have less cavity portions, and therefore the wick 45 can fully exhibit the function as a partitioning member between the vapor flow path 43 and the liquid returning flow path 44. In particular, when a porous material is used as the wick 45, the degradation in performance of the loop heat pipe 32 can be suppressed to about 10% even if the heat receiving portion 41 is set at a position higher than that of the heat radiating portion 42 to create a top heat state arranged in a vertical direction.

In this embodiment, the wick 45 includes the second projecting portion 45C projecting from the first projecting portion 45B to a position corresponding to the heat generating parts 25, and the thickness of the second projecting portion 45C is set no more than a half of the thickness of the main portion 45A. With this structure, the second projecting portion 45C can be formed into a thin plate shape. Thus, the surface area where the wick 45 is brought into contact with the first portion 41A can be increased, and the gasification of the working fluid can be promoted from this section. This is advantageous particularly to increase the surface area when such a thin loop heat pipe 32 is employed as in this embodiment.

Further, since the second projecting portion 45C is formed into a thin plate form, it is possible to prevent it from closing the first portion 41A of the heat receiving portion 41 to block the flow of the gasified portion of the working fluid. Focusing this point is particularly effective in such a case where a plurality of heal generating parts 25 are to be cooled down as in this embodiment. Further, since the second projecting portion 45C is provided such as to overlay with the heat generating parts 25, the heat conductivity between the heat generating parts 25 and the loop heat pipe 32 can be improved.

In this embodiment, the wick 45 includes the third projecting portion 45D projecting from the main portion 45A to the inside of the heat radiating portion 42, and the third projecting portion 45D projects to such a position where it partially overlays with the heat sink 33. With this structure, a certain amount of the liquefied portion of the fluid can be kept in the heat radiating portion 42 by the third projecting portion 45D, thereby making it possible to prevent the back-flow of the working fluid. Further, since the third projecting portion 45D is arranged such as to partially overlay with the heat sink 33, the heat conductivity of the overlapping section can be improved.

In this embodiment, the wick 45 includes the fourth projecting portion 45 projecting from the main portion 45A to the second region 44B, and the thickness of the fourth projecting portion 45E is set no more than a half of the thickness of the main portion 45A. With this structure, the angle dependency of the loop heat pipe 32 can be further reduced, and therefore the liquefied portion of the working fluid can be smoothly conveyed. Since the fourth projecting portion 45E can be formed into a thin plate shape, the surface of the cavity portion of the second region 44B can be kept large, thereby making possible to prevent the blockage of the flow of the working fluid through the second region 44B as much as possible. Further, the distance between the heat generating parts 25 and the second portion 41B of the heat receiving portion 41 can be made long, and therefore the temperature of the border section between the second portion 41B and the fourth projecting portion 45E of the wick 45 can be lowered, thereby making it possible to prevent the back-flow of the working fluid.

Figure 6:
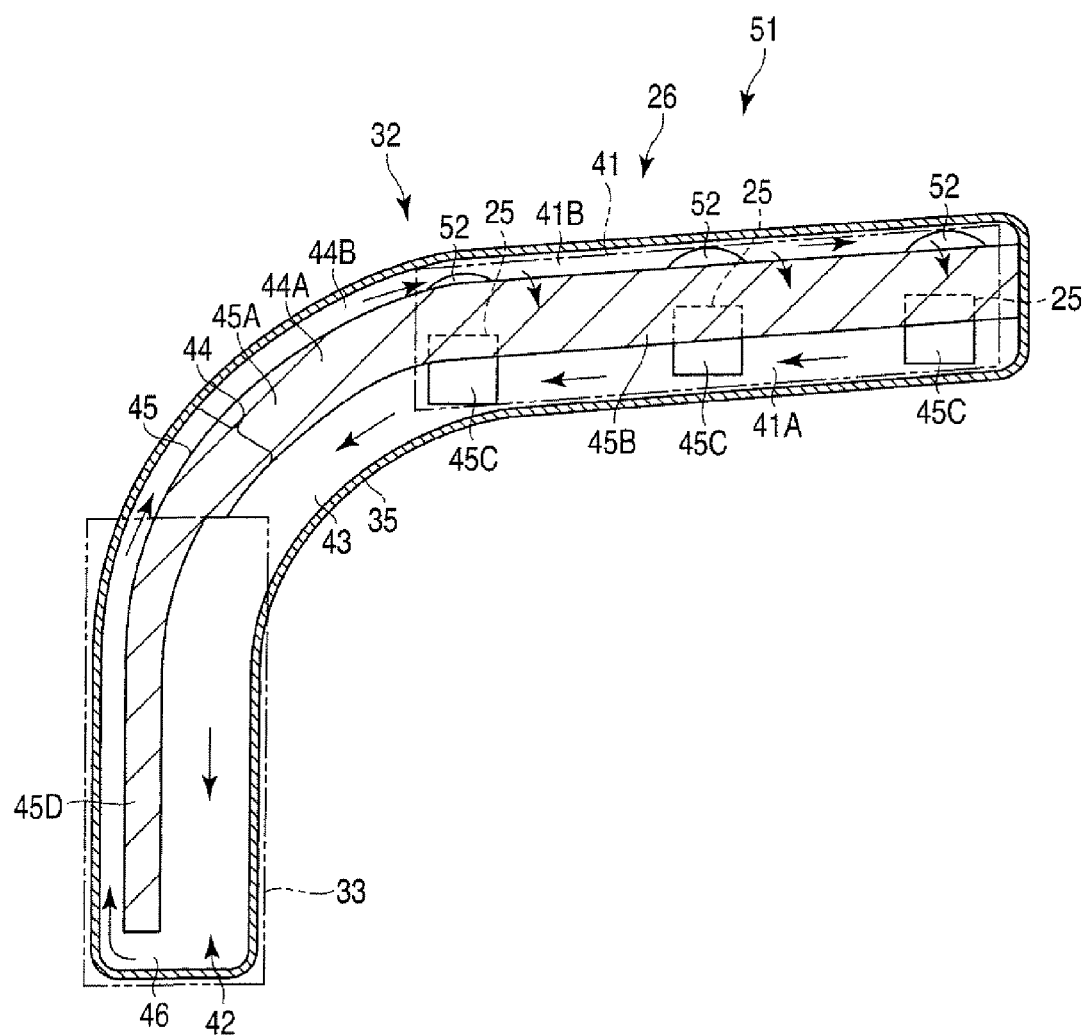
FIG. 6 is an exemplary cross sectional view of a portable computer, which is an example of the electronic device according to the second embodiment, taken along a horizontal direction of a loop heat pipe thereof.

Next, with reference to FIG. 6, the second embodiment of the electronic device will now be described A portable computer 51, which is an example of the electronic device of the second embodiment, is different from that of the first embodiment only in the structure of the fourth projecting portion 52 of the wick 45, and the other parts are common. Therefore, the following descriptions are made in connection with the part different from that of the first embodiment. Parts common to both embodiments are designated by the same reference numerals, and the descriptions for these parts will be omitted.

The wick 45 of the second embodiment includes a fourth projecting portion 52 projecting from the main portion 45A and the first projecting portion 45B to the second region 44B of the liquid returning flow path 44. The fourth projecting portion 52 projects to a region around the heat generating parts 25 in, for example, a semi-circular manner to correspond to the arrangement of the heat generating parts 25. The thickness of the fourth projecting portion 52 is set no more than a half of the thickness of the main portion 45A.

According to the second embodiment, the fourth projecting portion 52 projects to a position corresponding to the heat generating parts 25. With this arrangement, the cavity portion of the second region 44B of the liquid returning flow path 44 can be kept large. In this manner, the size of the fourth projecting portion 45F can be minimized. Thus, the fourth projecting portion 45E does not block the flow of the liquefied portion of the working fluid, and thus the working fluid can be made to flow smoothly in the liquid returning flow path 44. Further, the distance between the heat generating parts 25 and the second portion 41B of the heat receiving portion 41 can be made long, thereby making it possible to prevent the back-flow of the working fluid.

The electronic device of the present invention is not limited to the portable computers described above, but the invention can be applied to other types of electronic devices including a mobile information terminal. Further, the electronic device can be remodeled into various versions as long as it does not fall out of the scope of the invention.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. An electronic device comprising:
   a housing;
   a heat generating part in the housing; and
   a heat pipe in the housing and sealing a fluid therein, wherein:
   the heat pipe further comprises:
   a heat receiving unit configured to deprive heat of the heat generating part by gasification of the fluid;
   a heat radiating unit configured to release the heat received by the heat receiving unit by liquefying of the fluid;
   a vapor flow path configured to couple the heat receiving unit and the heat radiating unit to each other and allows a gasified portion of the fluid to flow from the heat receiving unit towards the heat radiating unit;
   a liquid returning flow path provided at a position distant from the vapor flow path, which couples the heat receiving unit and the heat radiating unit to each other and allows a liquefied portion of the fluid to flow from the heat radiating unit towards the heat receiving unit;
   a wick configured to return the liquefied portion of the fluid from the heat radiating unit to the heat receiving unit;
   a pair of plate members containing the wick therebetween, and attached to each other to make the heat receiving unit, the heat radiating unit, the vapor flow path and the liquid returning flow path annular around the wick; and
   a frame unit provided on outer peripheries of the plate members,
   wherein:
   the wick comprises a main portion and a first projecting portion extending from the main portion, the first projecting portion projecting towards an inside of the heat receiving unit such as to divide the inside of the heat receiving unit into a first portion communicating to the vapor flow path and a second portion communicating to the liquid returning flow path, and
   the heat receiving unit is thermally connected to the heat generating part at a position across the first portion and the first projecting portion.

2. The electronic device according to claim 1, wherein the wick comprises a second projecting portion which projects from the first projecting portion to a position where it overlays with the heat generating part, and a thickness of the second projecting portion is a half or less of a thickness of the main portion.

3. The electronic device according to claim 2, wherein the wick comprises a third projecting portion which projects from the main portion to an inside of the heat radiating part, and the third projecting portion projects to a position which partially overlays with a heat sink which promotes heat radiation in the heat radiating unit.

4. The electronic device according to claim 3, wherein:
   the liquid returning flow path comprises a first region in which the main portion of the wick is provided and a second region located distant from the main portion, and the wick comprises a fourth projecting portion projecting from the main portion towards the second region, and a thickness of the fourth projecting portion is a half or less of the thickness of the main portion.

5. The electronic device according to claim 4, wherein the fourth projecting portion projects to a position corresponding to the heat generating part.

6. A heat pipe in which a fluid is sealed, comprising:
a heat receiving unit configured to deprive heat of an external heat generating part by gasification of the fluid;
a heat radiating unit configured to release the heat to an outside received by the heat receiving unit by liquefying of the fluid;
a first flow path configured to couple the heat receiving unit and the heat radiating unit to each other and allows a gasified portion of the fluid to flow from the heat receiving unit towards the heat radiating unit;
a second flow path provided at a position distant from the first flow path, which couples the heat receiving unit and the heat radiating unit to each other and allows a liquefied portion of the fluid to flow from the heat radiating unit towards the heat receiving unit;
a wick configured to return the liquefied portion of the fluid from the heat radiating unit to the heat receiving unit;
a pair of plate members containing the wick therebetween, and attached to each other to make the heat receiving unit, the heat radiating unit, the first flow path and the second flow path annular around the wick; and
a frame unit provided on outer peripheries of the plate members,
wherein:
the wick comprises a main portion and a first projecting portion extending from the main portion, the first projecting portion projecting towards an inside of the heat receiving unit such as to divide the inside of the heat receiving unit into a first portion communicating to the first flow path and a second portion communicating to the second flow path, and
the heat receiving unit is thermally connected to the heat generating part at a position across the first portion and the first projecting portion.

7. The heat pipe according to claim 6, wherein the wick comprises a second projecting portion which projects from the first projecting portion to a position where it overlays with the heat generating part, and a thickness of the second projecting portion is a half or less of a thickness of the main portion.

8. The heat pipe according to claim 7, wherein the wick comprises a third projecting portion which projects from the main portion to an inside of the heat radiating part, and the third projecting portion projects to a position which partially overlays with a heat sink which promotes heat radiation in the heat radiating unit.

9. An electronic device comprising:
a housing;
a heat generating part in the housing; and
a heat pipe in the housing and sealing a fluid therein, heat pipe comprises:
a wick;
a heat receiving unit configured to receive heat from the heat generating part;
a heat radiating unit configured to release to an outside the heat received by the heat receiving unit;
a first flow path extending between the heat receiving unit and the heat radiating unit to allow a gasified portion of the fluid to flow from the heat receiving unit to the heat radiating unit;
a second flow path extending between the heat receiving unit and the heat radiating unit to allow a liquefied portion of the fluid to flow from the heat radiating unit to the heat receiving unit;
a pair of plate members containing the wick therebetween, and attached to each other to make the heat receiving unit, the heat radiating unit, the first flow path and the second flow path annular around the wick; and
a frame unit provided on outer peripheries of the plate members,
wherein:
the wick comprises a main portion and a first projecting portion extending from the main portion, the first projecting portion dividing an inside of the heat receiving unit into a first portion communicating to the first flow path and a second portion communicating to the second flow path, and
the heat receiving unit is thermally connected to the heat generating part at a position across the first portion and the first projecting portion.

* * * * *